United States Patent
Kurita

[19]

[11] Patent Number: 6,163,186
[45] Date of Patent: Dec. 19, 2000

[54] SYSTEM INCLUDING PHASE LOCK LOOP CIRCUIT

[75] Inventor: Kozaburo Kurita, Ome, Japan

[73] Assignee: Hitachi, Ltd., Tokyo, Japan

[21] Appl. No.: 08/966,786

[22] Filed: Nov. 10, 1997

[30] Foreign Application Priority Data

Nov. 11, 1996 [JP] Japan .................................. 8-314226

[51] Int. Cl.[7] .................................................. H03L 7/06
[52] U.S. Cl. ......................... 327/157; 327/148; 331/1 A; 331/DIG. 2; 375/376
[58] Field of Search .................................. 327/156, 157, 327/158, 159, 530, 147, 148; 331/5, 75, 8, 108, 295, 1 A, 17, 25, 11, 12, DIG. 2; 375/373–376

[56] References Cited

U.S. PATENT DOCUMENTS

| | | | |
|---|---|---|---|
| 5,117,205 | 5/1992 | Nauta | 331/117 FE |
| 5,191,239 | 3/1993 | Rogers | 326/110 |
| 5,220,293 | 6/1993 | Rogers | 331/15 |
| 5,304,953 | 4/1994 | Heim et al. | 331/1 A |
| 5,552,643 | 9/1996 | Morgan | 307/81 |
| 5,686,868 | 11/1997 | Hasegawa | 331/75 |
| 5,783,956 | 7/1998 | Ooishi | 327/157 |

FOREIGN PATENT DOCUMENTS

| | | |
|---|---|---|
| 547 770 | 6/1993 | European Pat. Off. . |
| 547 773 | 6/1993 | European Pat. Off. . |
| 5-284014 | 10/1993 | Japan . |
| 5-315948 | 11/1993 | Japan . |

OTHER PUBLICATIONS

IEEE Journal of Solid–State Circuits, vol. SC–22, No. 2, Apr., 1987, "Design of PLL–Based Clock Generation Circuits", Jeong et al, pp. 255–261.

*Primary Examiner*—Timothy P. Callahan
*Assistant Examiner*—Minh Nguyen
*Attorney, Agent, or Firm*—Beall Law Offices

[57] ABSTRACT

A PLL circuit includes a phase comparator which makes a comparison between an internal clock signal and a clock signal supplied from an external terminal, a charge pump circuit which produces a charging-up or discharging current in accordance with the output of the phase comparator, so as to drive a filter capacitor, a voltage-controlled oscillator the oscillation frequency of which is controlled by the held voltage of the filter capacitor, and a frequency divider circuit which generates the internal clock signal on the basis of the oscillation output of the voltage-controlled oscillator. The PLL circuit is additionally provided with a voltage detector circuit which detects whether the held voltage of the filter capacitor has been raised to a predetermined voltage or higher, and the function of forcibly lowering the held voltage of the filter capacitor down to a predetermined potential in accordance with the detection output of the voltage detector circuit. Besides, a system is provided with a detection and setting circuit which detects a state brought about by the electrical disconnection of the feedback loop of the PLL circuit, and which brings the PLL circuit into a predetermined state.

3 Claims, 13 Drawing Sheets

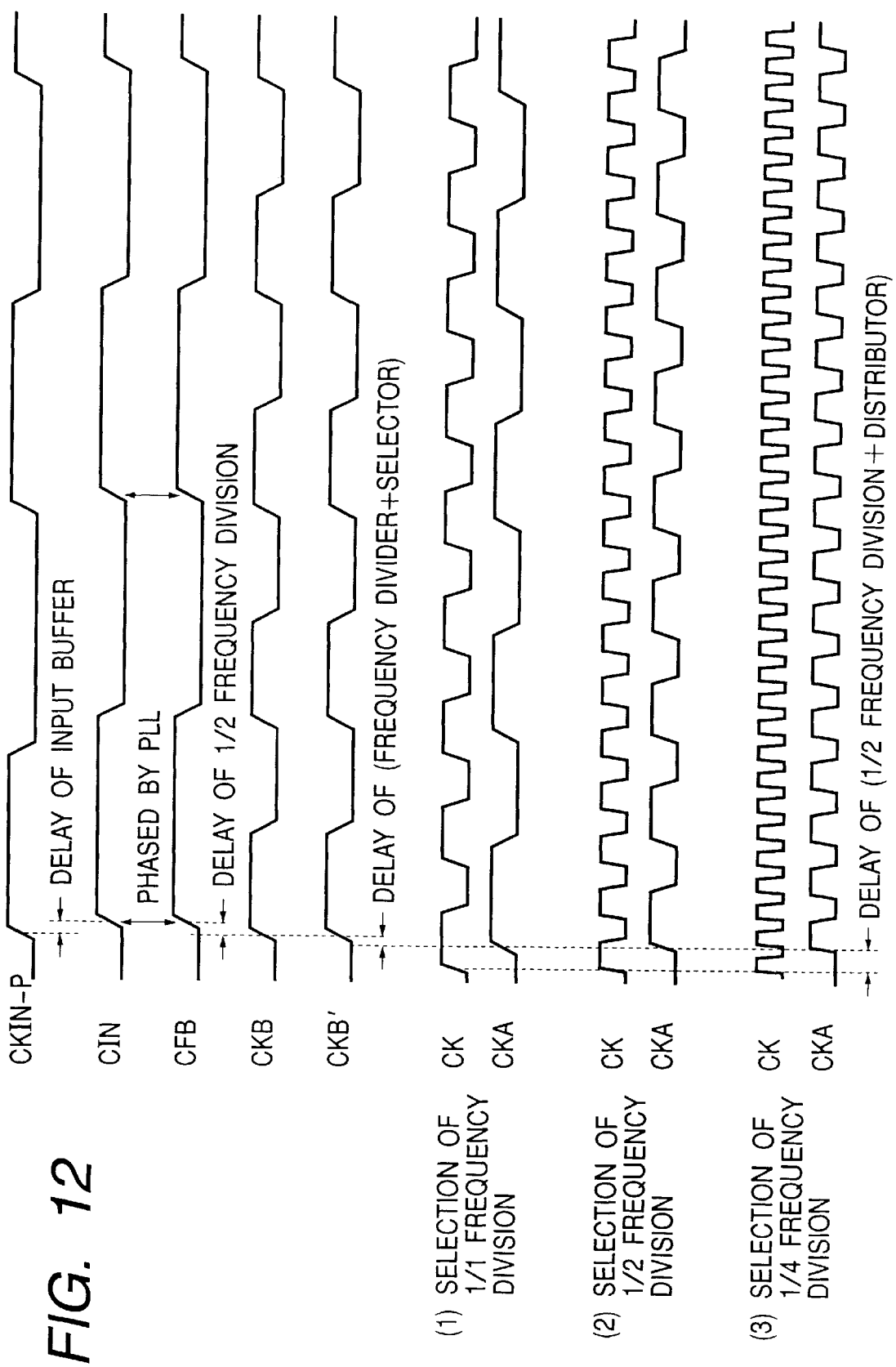

SYSTEM INCLUDING PHASE LOCK LOOP CIRCUIT

BACKGROUND OF THE INVENTION

The present invention relates to a system having a PLL (phase lock loop) circuit, and to techniques effectively applicable to a system including a semiconductor integrated circuit device such as a CMOS gate array in which a clock signal is generated by a PLL circuit and which includes a logic circuit operating in accordance with the clock signal.

Logic circuits which operate in synchronism with a clock signal. A circuit for generating a clock signal have been known is disclosed in "IEEE Journal of Solid-State Circuits", Vol. SC-22, No. 2 (1987), pp. 255–261. Besides, PLL circuits are disclosed in, for example, Japanese Patent Applications Laid-open No. 284014/1993 and No. 315948/1993.

SUMMARY OF THE INVENTION

The present inventor has found out that problems stated below are caused when a clock signal is generated using a PLL circuit built in a semiconductor integrated circuit device.

The PLL circuit includes a phase comparator circuit, a voltage-controlled oscillator, and a control circuit by which a control voltage for the voltage-controlled oscillator is produced in accordance with the output from the phase comparator circuit. The phase comparator circuit compares a reference clock signal and the clock signal outputted from the voltage-controlled oscillator. The inventor's study has revealed that a feedback loop for supplying the clock signal from the voltage-controlled oscillator to the phase comparator circuit is sometimes cut off electrically, and a desired clock signal cannot be derived from the PLL circuit on such an occasion. The situation of such electrical disconnection of the feedback loop which has been revealed by the inventor's study, will be explained below.

1) When a semiconductor integrated circuit device having a built-in PLL circuit is supplied with a reference clock signal from outside, and a feedback clock signal outputted from the integrated circuit device is supplied to the integrated circuit device through the feedback loop laid outside this integrated circuit device, the voltage-controlled oscillator etc., included in the integrated circuit device tend to have a higher upper-limit frequency with the enhancement of the performance of the circuit elements. On the other hand, the feedback loop of the PLL is an external signal path, and the upper-limit frequency which can be transmitted in the feedback loop is suppressed to a low frequency.

In this regard, the voltage-controlled oscillator starts oscillating at a free-run frequency, for example, immediately after the power-on of the integrated circuit device. Before the output of the voltage-controlled oscillator is inputted as the feedback signal to the phase comparator through the external signal path (in other words, while the feedback loop is electrically disconnected), the phase comparator judges that the voltage-controlled oscillator is not oscillating and produces an output of the phase comparison result corresponding to such a state. The produced output charges up a filter capacitor through a charge pump circuit which constitutes a control circuit for producing the control voltage for the voltage-controlled oscillator. In consequence, the voltage-controlled oscillator heightens its oscillation frequency more and more. When the oscillation frequency has consequently exceeded the upper-limit frequency of the signal of the signal transmission path in the feedback loop, the phase comparator is no longer fed back with the output of the voltage-controlled oscillator through the feedback loop though the voltage-controlled oscillator is oscillating at a high frequency near the upper-limit frequency as stated above. Consequently, the phase comparator continues to deliver the phase comparison result which raises the oscillation frequency, until the integrated circuit device finally becomes incapable of generating the clock signal. Therefore, a runaway occurs in which a circuit sequence operation conforming to such a clock signal cannot be executed. This problem is considered to be solvable by laying the feedback loop inside the integrated circuit device. However, when the feedback loop is formed within the integrated circuit device, it becomes difficult to output the clock signal corresponding to the reference clock signal supplied thereto because the characteristics of circuit elements constituting the feedback loop vary in the manufacture of the integrated circuit device. Consequently, a circuit which operates in accordance with the output clock signal of the LSI might operate at a timing which differs from the reference clock signal.

2) Electrical disconnection of the feedback loop takes place also when the PLL circuit is provided with a plurality of frequency divider circuits having frequency division ratios different from one another, and the frequency of the feedback clock signal to be supplied to the phase comparator circuit through the feedback loop is determined by selecting one of the frequency divider circuits. In this case, the feedback clock signal is not supplied to the phase comparator circuit through the feedback loop before the selection of a desired frequency divider circuit. Therefore, the phase comparator continues to output the phase comparison result which raises the oscillation frequency, and a circuit which operates in accordance with the output clock signal runs away.

This problem can be solved by actuating the phase comparator circuit after the selection of the desired frequency divider circuit. It is, however, necessary to generate a control signal for controlling the actuation of the phase comparator circuit.

3) Further, electrical disconnection of the feedback loop can take place when a plurality of kinds of operating voltage are supplied to the PLL circuit. By way of example, a power supply voltage which is required for the voltage-controlled oscillator circuit etc., constituting the PLL circuit, is sometimes different from a power supply voltage which is required for a bus interface for transferring the output clock signal of the PLL circuit to another semiconductor integrated circuit device. In this case, in order that the clock output section of the PLL circuit is provided with a bus interface function, at least two kinds of power supply voltage must be fed to the PLL circuit. Here, if, for example, the supply of the power supply voltage which is fed to the clock output portion lags behind that of the power supply voltage which is fed to the voltage-controlled oscillator circuit etc., the feedback clock signal from the clock output section is fed late to the phase comparator circuit through the feedback loop. Therefore, a state in which the feedback loop is electrically disconnected occurs. This results in a runaway of the integrated circuit device which operates in accordance with the clock signal.

This problem can be avoided by setting a limitation on the power-on sequence of the power supply voltages. Undesirably, however, the usage of the integrated circuit device is restricted.

An object of the present invention is to provide a semiconductor integrated circuit device including a PLL circuit which can reliably and stably generate a clock signal synchronized with a clock signal supplied from outside.

Another object of the present invention is to provide a system having a semiconductor integrated circuit device which includes a PLL circuit that can be, and easily used.

Still another object of the present invention is to provide a system having a semiconductor integrated circuit device which includes a PLL circuit, without an increase in the number of constituent elements and being easy of use.

The above and other objects and novel features of the present invention will become apparent from the description of this specification when read in conjunction with the accompanying drawings.

Typical aspects of the present invention will be briefly summarized below.

A PLL circuit includes a phase comparator which makes a comparison between a reference clock signal and an internal clock signal, a charge pump circuit which produces a charging-up or discharging current in accordance with the output of the phase comparator, so as to drive a filter capacitor, a voltage-controlled oscillator the oscillation frequency of which is controlled by the held voltage of the filter capacitor, and a frequency divider circuit which generates the internal clock signal on the basis of the oscillation output of the voltage-controlled oscillator; the PLL circuit comprising a voltage detector circuit which detects that the held voltage of the filter capacitor has reached, at least, a predetermined voltage, and having the function of forcibly lowering the held voltage of the filter capacitor to a predetermined potential in accordance with the detection output of the voltage detector circuit.

A system comprises a PLL circuit which is operated by receiving, at least, a first power supply voltage and a second power supply voltage, a semiconductor integrated circuit device which includes a setting circuit for detecting the state of the PLL circuit and setting the PLL circuit when the PLL circuit is not in a predetermined state, a first switching circuit which serves to feed the first power supply voltage to the integrated circuit device, and a second switching circuit which serves to feed the second power supply voltage to the integrated circuit device.

A system includes a semiconductor integrated circuit device which includes a phase comparator circuit, a voltage-controlled oscillator, a control circuit for controlling the voltage-controlled oscillator in accordance with the output from the phase comparator circuit, a first external terminal for supplying a reference clock signal to the phase comparator circuit, a second external terminal for supplying a feedback clock signal to the phase comparator circuit, and a third external terminal for outputting the feedback clock signal conforming to the output from the voltage-controlled oscillator; and a feedback signal line which is laid outside the LSI and which connects the second external terminal and the third external terminal; a setting circuit being provided which detects the state of a PLL circuit constructed of the phase comparator circuit, the control circuit, the voltage-controlled oscillator and the feedback signal line and which sets the PLL circuit when this PLL circuit is not in a predetermined state.

A semiconductor integrated circuit device comprises a PLL circuit which includes a phase comparator circuit for detecting the phase difference between a reference clock signal and a feedback clock signal, a voltage-controlled oscillator, a control circuit for controlling the voltage-controlled oscillator in accordance with the output from the phase comparator circuit, and a selector circuit for receiving the output from the voltage-controlled oscillator so as to supply a clock signal of one of a plurality of frequencies different from one another, to the phase comparator circuit as the feedback clock signal; and a setting circuit which detects the state of the PLL circuit and sets the PLL circuit when this PLL circuit is not in a predetermined state.

BRIEF DESCRIPTION OF THE DRAWINGS

FIG. 12 is an operating waveform diagram corresponding to FIG. 11(A); and

DESCRIPTION OF THE PREFERRED EMBODIMENTS

Figure 1:
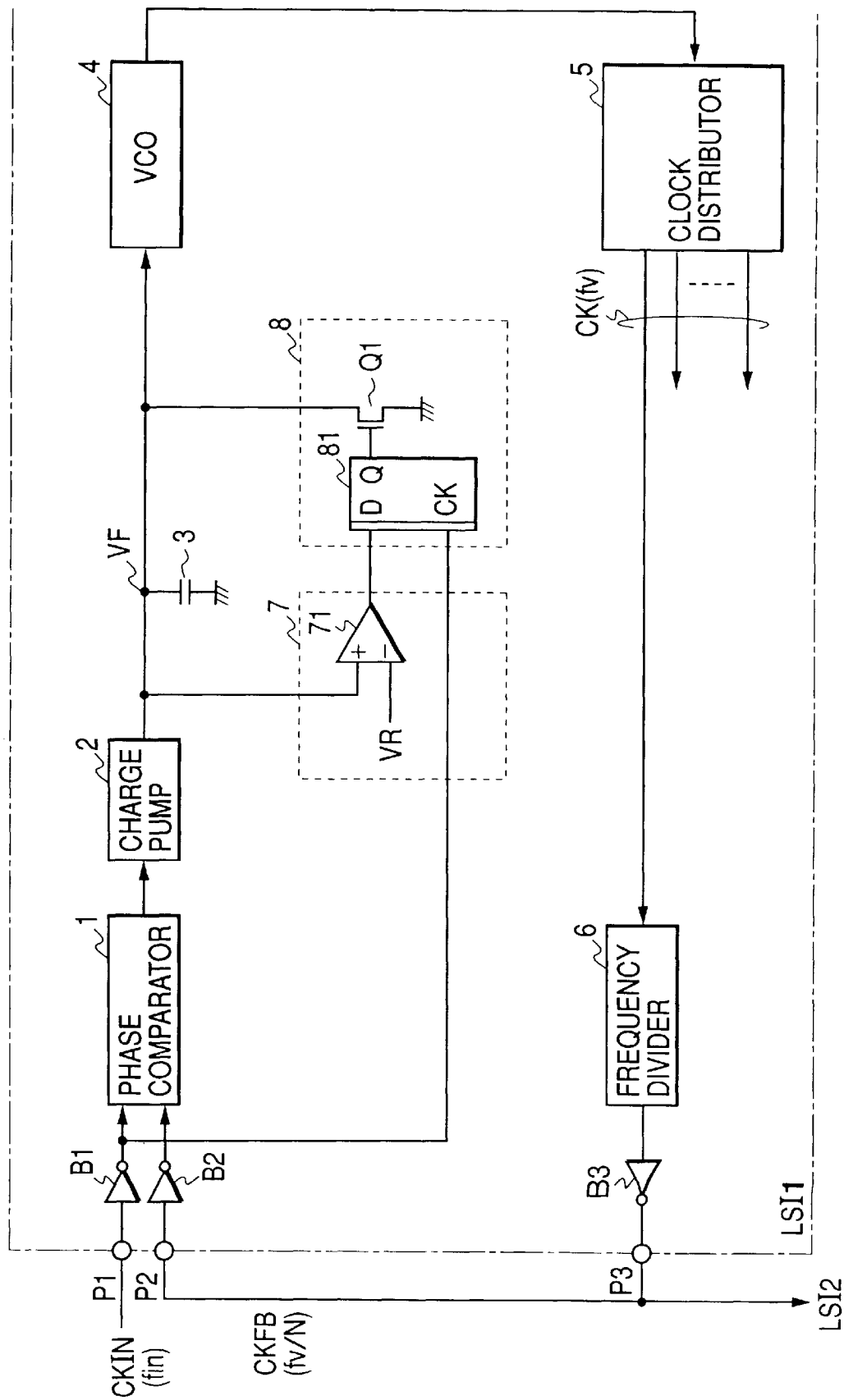
FIG. 1 is a block diagram showing an embodiment of a clock pulse generator circuit according to the present invention.

FIG. 1 illustrates a block diagram of an embodiment of a clock pulse generator circuit according to the present invention. Although not especially restricted, an external clock signal CKIN as reference is fed to a semiconductor integrated circuit device LSI1 through an external terminal P1. The clock signal fed through the external terminal P1 is fed to one input of a phase comparator 1 through an input buffer B1. The output signal of the phase comparator 1 is outputted to a charge pump circuit 2, by which a charging-up or discharging current is produced. The current produced by the charge pump circuit 2 is fed to a filter capacitor 3, and is smoothed here. That is, it is converted into a D.C. control voltage VF. The control voltage VF is inputted to the control terminal of a voltage-controlled oscillator (VCO) 4. The output signal of the voltage-controlled oscillator 4 is fed to a clock distributor 5 so as to distribute clock signals of frequency fv to the internal circuits.

One of the output signals of the clock distributor 5 has its frequency fv divided by a frequency divider circuit 6, and the resulting signal is outputted from an external terminal P3 through an output buffer B3. The externally outputted signal is fed to an external terminal P2 through an external wiring line, and is fed back to the other input of the phase comparator 1 through an input buffer B2 similar to the foregoing input buffer B1. In this way, the internal clock signal CK is set at the frequency fv which is N times as high as the frequency of the clock signal CKIN supplied from outside. Although not especially restricted, the clock signal CKFB fed as the output from the external terminal P3 is used as the clock signal of another semiconductor integrated circuit device LSI2 not shown.

A large-sized computer or the like has circuit blocks divided according to its functions, and each of them is constructed of a single semiconductor integrated circuit device. Each of such integrated circuit devices executes corresponding signal processings, and the plurality of integrated circuit devices operate in cooperation, whereby a desired information processing operation is executed. In this case, the plurality of integrated circuit devices need to be operated in synchronism with one another in order to quickly transfer signals among them. In those two of the integrated circuit devices which transfer the signals therebetween in this manner, it is necessary, by way of example, to build a clock pulse generator circuit in one of the integrated circuit devices and to supply the other integrated circuit device with a clock signal which is synchronized with a clock signal generated by the clock pulse generator circuit. In the semiconductor integrated circuit device LSI1 which includes the built-in clock pulse generator circuit, the phases of the clock signals are compared by the internal phase comparator 1 so as to establish synchronization with the reference clock signal. To synchronize the clock signals in a more perfect state between at least two integrated circuit devices, it is desirable that the clock signal generated by the clock pulse generator circuit is outputted from the external terminal P3, and the output clock signal and the reference clock signal are inputted to the phase comparator 1 through the input buffers B1, B2 constructed of the same circuits. Thus, the reference clock signal CKIN and the output clock signal CKFB can be synchronized in the more perfect state.

In this embodiment, circuits to be described below are added so as to detect the runaway state of the integrated circuit device and eliminate the runaway state to restore a normal operating state. As described before, the runaway occurs when the oscillation frequency of the voltage-controlled oscillator 4 has exceeded the upper-limit frequency of a signal transmission path comprising the clock distributor 5, frequency divider 6, external terminal P3 and external wiring line.

Regarding the held voltage VF of the filter capacitor 3, an abnormal state is detected by voltage detection means 7. More specifically, the voltage detection means 7 is constructed of a voltage comparator 71 which is supplied with the held voltage VF of the filter capacitor 3 at its non-inverting input node (+) and with a voltage to be detected at its inverting input node (-). The voltage VR is set at a predetermined voltage which is sufficiently high as compared with the control voltage VF corresponding to the oscillation frequency to be generated in the voltage-controlled oscillator 4. In other words, it is set at a high voltage which cannot exist in an ordinary PLL (phase lock loop).

The output signal of the voltage detection means 7 is transferred to discharge means 8 for the filter capacitor 3. The discharge means 8 is constructed of a flip-flop circuit 81, and a MOSFET Q1 which is subjected to switching control by the output of the flip-flop circuit 81. Such a MOSFET Q1 forms a path for discharging the filter capacitor 3. Although not especially restricted, the clock terminal CK of the flip-flop circuit 81 is supplied with the reference clock signal which is fed to one input of the phase comparator 1.

When, immediately after the turn-on of a power source, the filter capacitor 3 has been excessively charged up to incur the abnormal state in which the oscillation frequency of the voltage-controlled oscillator 4 exceeds the upper-limit frequency of the feedback loop, such an abnormality of the held voltage VF of the filter capacitor 3 is detected by the voltage detection means 7. The flip-flop circuit 81 is inverted in synchronism with the clock signal CKIN on the basis of the output of the voltage detection means 7, and the switching MOSFET Q1 is turned on to forcibly discharge the filter capacitor 3. When the held voltage VF is still higher than the detection voltage VR in the next cycle of the clock signal CKIN, the flip-flop circuit 81 maintains its set state to continue the discharging operation. In contrast, when the held voltage VF is lower than the detection voltage VR in the next cycle of the clock signal CKIN, the flip-flop circuit 81 is reset to stop the discharging operation. Then, the filter capacitor 3 has the held voltage VF conforming to the output of the charge pump circuit 2, and the control operation of the PLL starts.

That is, the detection means 7 and the discharge means 8 lower the held voltage VF in the abnormal state of the PLL in response to the abnormal state having occurred as described above. Once the PLL has fallen into its normal state, the output of the voltage comparator 71 becomes a low level, and the flip-flop circuit 81 is held in the reset state to keep the switching MOSFET Q1 in its OFF state, so that the discharging operation described above is not performed.

Figure 2:
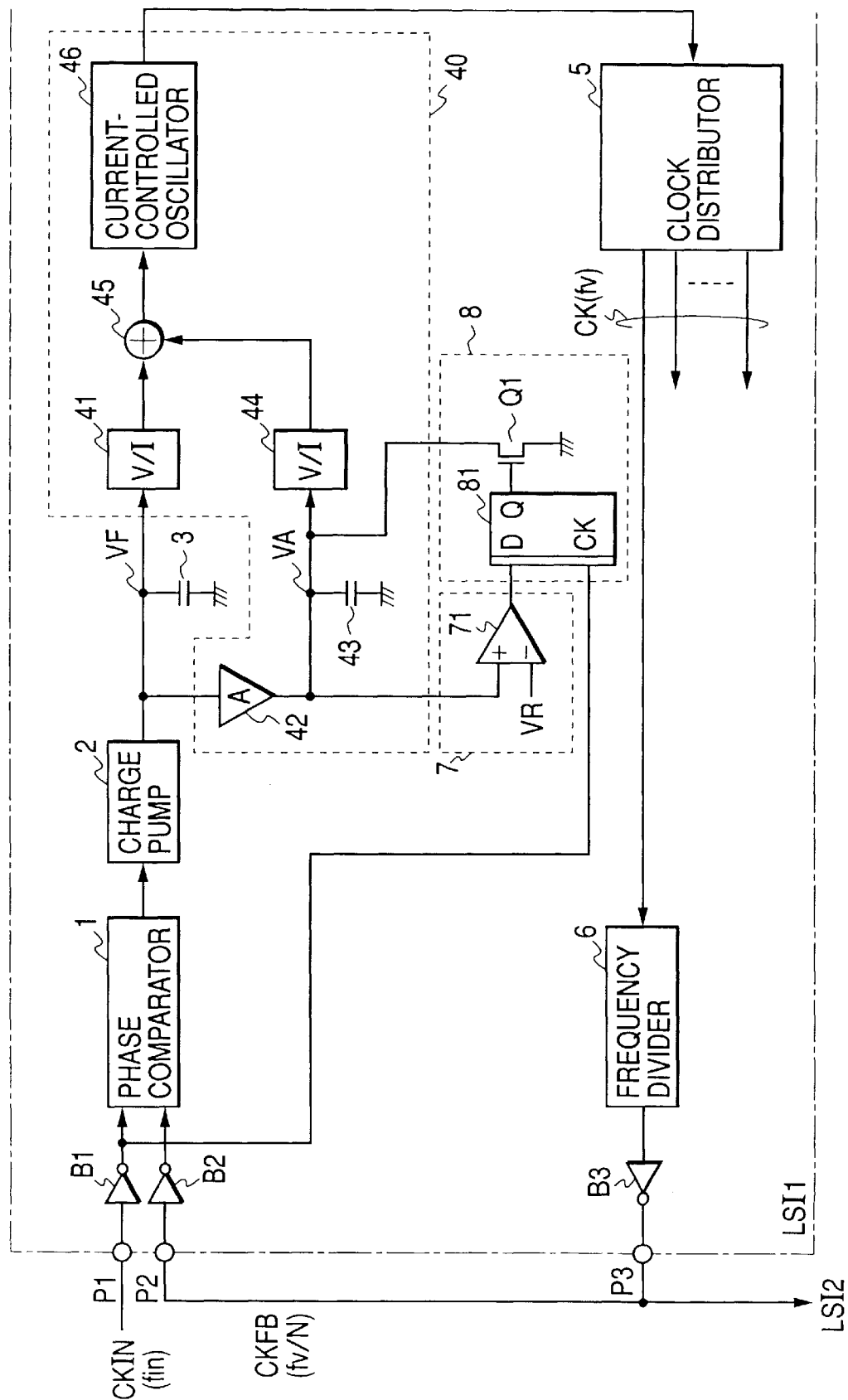
FIG. 2 is a block diagram showing another embodiment of a clock pulse generator circuit according to the present invention.

FIG. 2 illustrates a block diagram of another embodiment of a clock pulse generator circuit according to the present invention. In this embodiment, the construction of a voltage-controlled oscillator 40 will be described below. The held voltage VF of the filter capacitor 3 is converted into a current signal by a voltage-to-current converter 41. In addition, the held voltage VF drives a filter capacitor 43 through a voltage amplifier circuit 42.

The held voltage VA of the filter capacitor 43 is converted into a current signal by a voltage-to-current converter 44. The current signals generated by the two voltage-to-current converters 41 and 44 are added up by an adder 45, and the sum is used as a control current for a current-controlled oscillator 46.

In this embodiment, there are provided a fast path of high response in which the held voltage VF of the filter capacitor 3 is directly converted into the current by the voltage-to-current converter 41, and a slow path of low response in which the above voltage VF is amplified by the voltage amplifier 42 and the held voltage VA of the filter capacitor 43 driven by the output of the voltage amplifier 42 is converted into the current by the voltage-to-current converter 44. The oscillation frequency of the current-controlled oscillator 46 is controlled by the combined output of the currents. In this case, the gain of the fast path having a high response is set to be low, and that of the slow path having a low response is set to be high, whereby stable PLL operation is performed in a wide operating range.

Also in this embodiment, the circuits for detecting and eliminating the abnormal operation as described before are additionally disposed. In this case, the slow path which controls the PLL predominantly is provided with the voltage detection means 7 and the discharge means 8. More specifically, the voltage comparator 71 compares the held voltage VA of the filter capacitor 43 with the voltage VR, and the switching MOSFET Q1 which is controlled by the output of the flip-flop circuit 81 is connected so as to form a path for discharging the filter capacitor 43.

Figure 3:
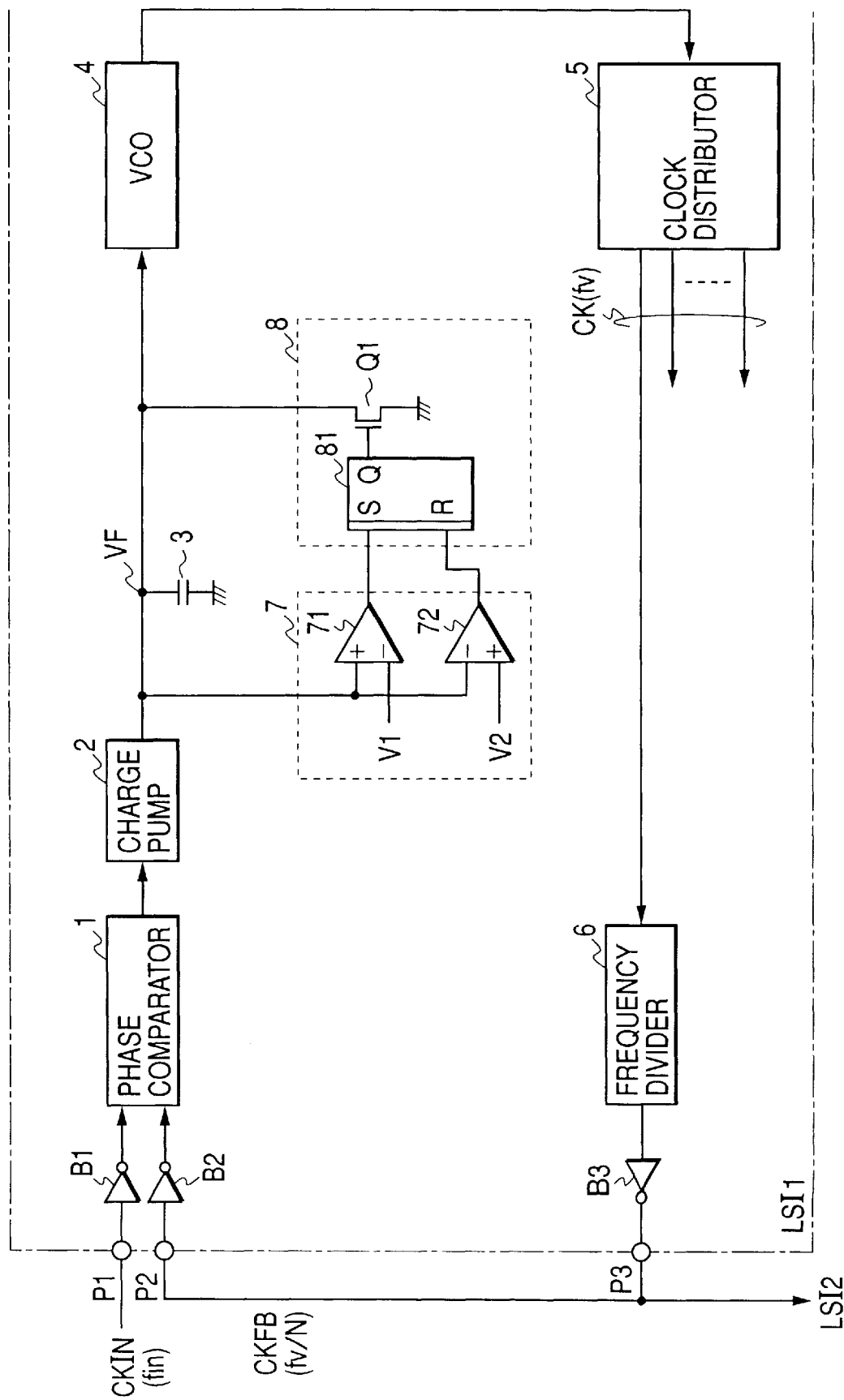
FIG. 3 is a block diagram showing still another embodiment of a clock pulse generator circuit according to the present invention.

FIG. 3 illustrates a block diagram of still another embodiment of a clock pulse generator circuit according to the present invention. In this embodiment, two voltage comparators 71 and 72 are employed for the voltage detection means 7. The voltage comparator 71 is supplied with a first voltage V1 for detecting an abnormal state as stated before. Applied to the voltage comparator 72 is a second voltage V2 for stopping the discharging operation of the discharge means 8. The flip-flop circuit 81 of the discharge means 8 is of a set/reset type. To the voltage comparator 71, the held voltage VF to be detected is applied to its non-inverting input node (+) in order to generate an output signal of high level when the held voltage VF of the filter capacitor 3 has become higher than the voltage V1. On the other hand, to the voltage comparator 72, the second voltage V2 is applied to its non-inverting input node (+) and the held voltage VF to-be-detected is applied to its inverting input node (−) in order to reset the flip-flop circuit 81 when the held voltage VF of the filter capacitor 3 has been detected to be lower than the second voltage V2, in other words, in order to generate an output signal of high level when VF<V2 has held as stated above.

The voltage detection means 7 in this embodiment executes a voltage comparing operation with hysteresis characteristics based on the voltages V1 and V2, and it controls the set/reset state of the flip-flop circuit 81 so as to discharge the filter capacitor 3. Due to such discharge control, even when the held voltage VF of the filter capacitor 3 is abnormally high at the time of, e. g., the turn-on of the power source, recovery operation can be made is reponse to the abnormally high voltage VF so as to operate the PLL normally. The voltage detection means in this embodiment is applicable also to the circuit of the foregoing embodiment shown in FIG. 2.

Figure 4A:
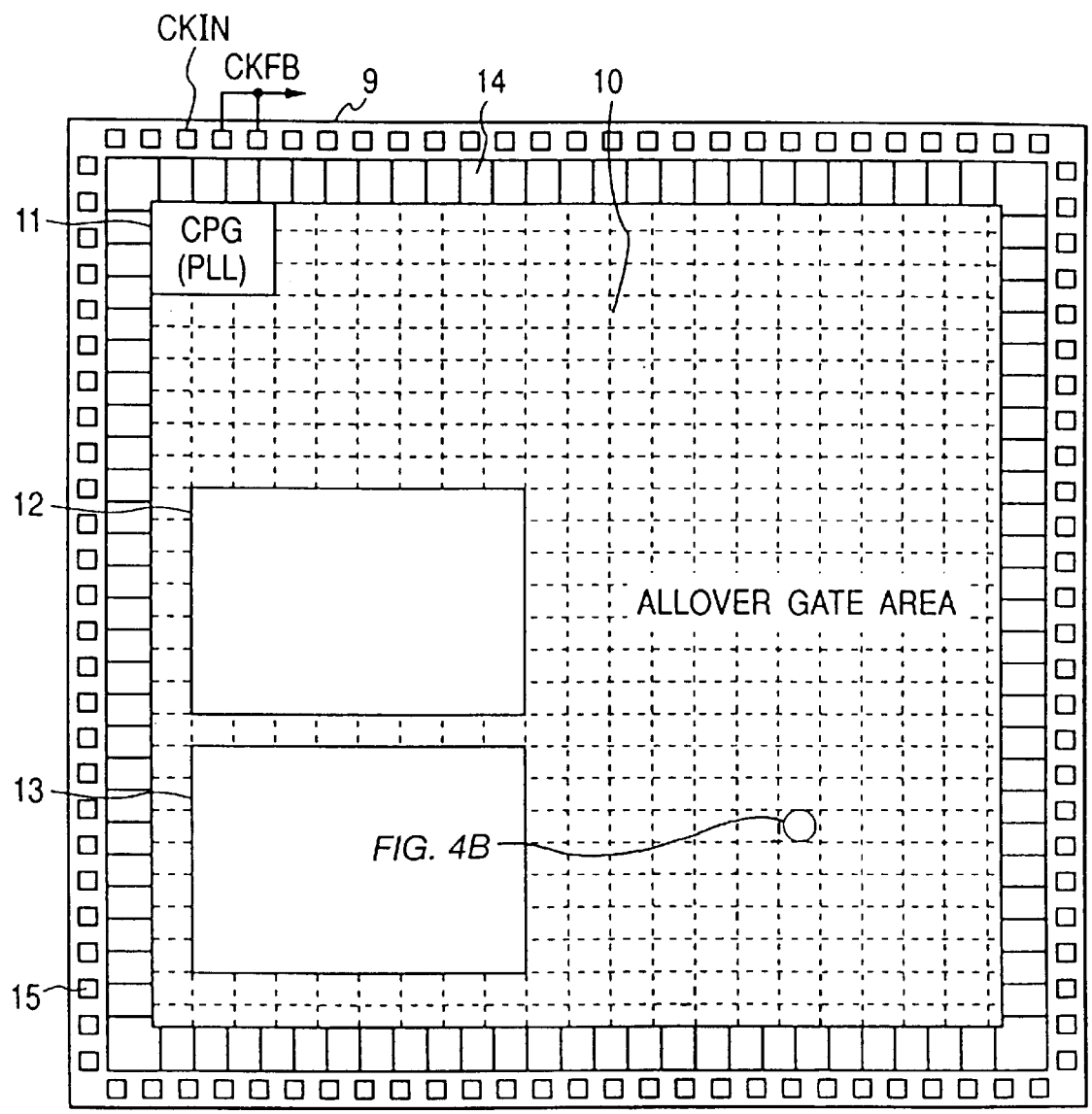
FIGS. 4A and 4B are views showing an embodiment of a semiconductor integrated circuit device according to the present invention.
Figure 4B:
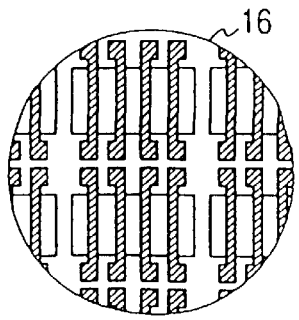

FIGS. 4A and 4B illustrate views of an embodiment of a semiconductor integrated circuit device according to the present invention. Individual circuit blocks in the figure are depicted in agreement with actual geometrical layout on a semiconductor substrate. The circuit blocks in the figure are formed on the semiconductor substrate of, e. g., single-crystal silicon by known techniques for manufacturing semiconductor integrated circuits.

Referring to the figure, a semiconductor chip 9 includes internal circuits 10, a clock pulse generator circuit CPG 11, on-chip RAMs 12 and 13, and other logic circuit portions. The clock pulse generator circuit 11 is constructed of one of the PLL circuits shown in FIGS. 1 to 3. The on-chip RAMs 12 and 13 are constructed of RAM macros. The area where the internal circuits 10 are formed, is an allover gate area except the RAM blocks, and respective functions are realized by the design of connections in the gate area. MOSFETs are formed all over the gate area as shown by the enlarged pattern 16 of this area. Bonding pads 15 are disposed at the peripheral part of the semiconductor chip 9, and an input/output circuit portion 14 is interposed between such bonding pads 15 and the internal circuits 10. In the logic circuit portion, circuits for realizing the functions corresponding to their uses.

The clock pulse generator circuit 11 may be constructed of circuit elements which are exclusively designed similarly to the RAM macro. In addition, such an integrated circuit device 9 and another integrated circuit device which transmits/receives signals to/from the integrated circuit device 9 may be operated by a clock signal generated by the clock pulse generator circuit 11. In order to attain such functions, part of a feedback loop is constructed through the bonding pads 15 which are connected to external terminals.

Figure 5:
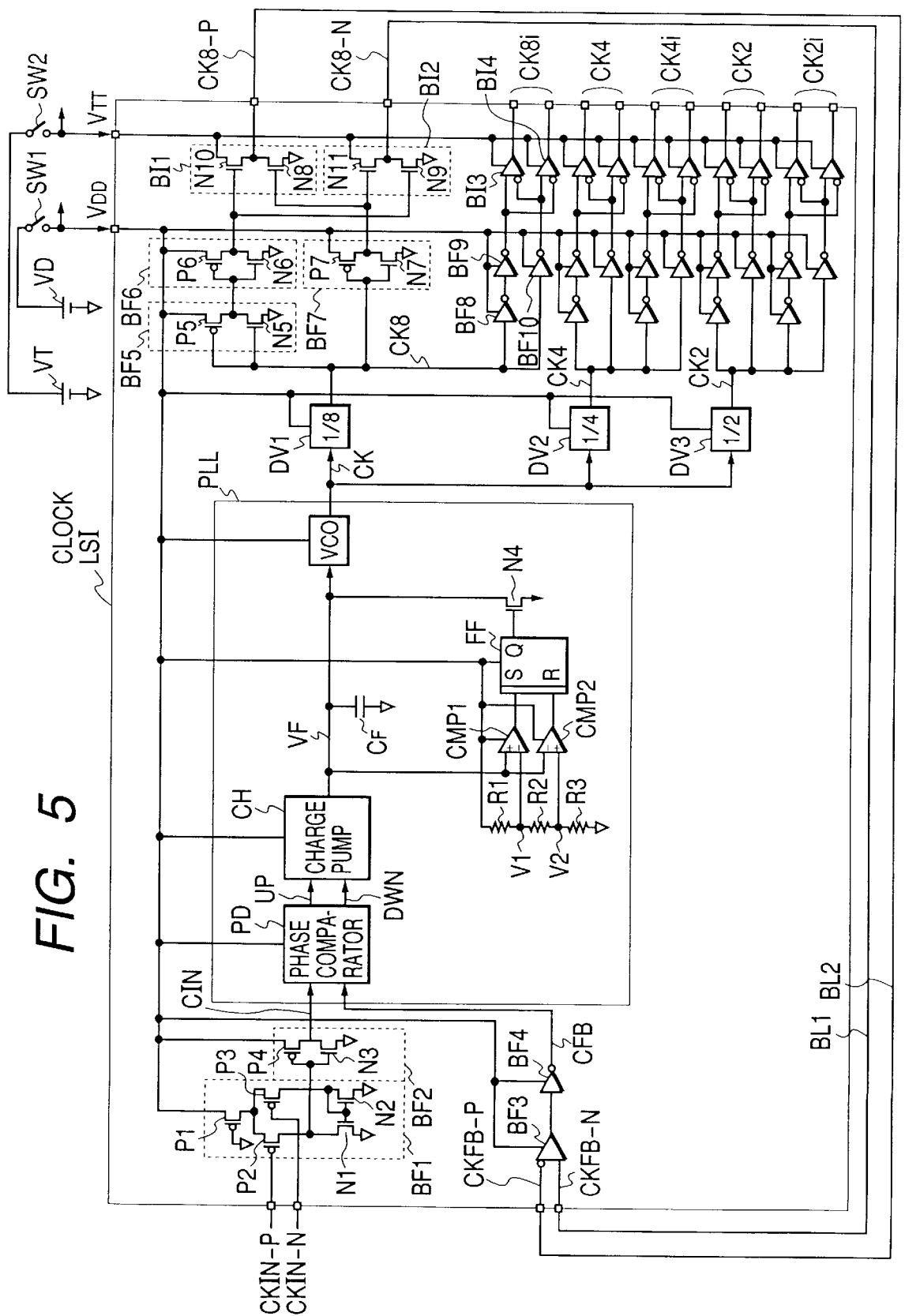
FIG. 5 is a block diagram of a system which employs a semiconductor integrated circuit device including a clock pulse generator circuit.

FIG. 5 illustrates a block diagram of a system to which the present invention is applied. Referring to the figure, a clock LSI is a semiconductor integrated circuit device which is formed on a single semiconductor substrate by well-known semiconductor manufacturing techniques.

Reference clock signals CKIN-P, CKIN-N (here, symbols -P and -N denote signals which are opposite in phase to each other, and the same will hold in the following description) are supplied through corresponding external terminals to an input buffer BF1 which is configured of P-channel MOSFETs P1 to P3 and N-channel MOSFETs N1 to N2. The output of the input buffer BF1 is supplied as a clock signal CIN to one input terminal of a phase comparator PD through an input buffer BF2 which is configured of a P-channel MOSFET P4 and an N-channel MOSFET N3. The other input terminal of the phase comparator PD is supplied with a feedback clock signal CFB through an input buffer BF3 having the same circuit arrangement as that of the input buffer BF1 and an input buffer BF4 having the same circuit arrangement as that of the input buffer BF2. The feedback clock signal CFB is fed from the semiconductor integrated circuit device through an external terminal and feedback signal lines BL1 and BL2 laid outside the integrated circuit device. In this manner, using the feedback signal lines laid outside, and employing the input buffers BF1 and BF3 with the same constructions and the input buffers BF2 and BF4 with the same constructions, it is possible to bring into agreement the clock signal at the external input terminal for the reference clock signal and the corresponding clock signal at the external input terminal for the feedback clock signal.

The phase comparator PD compares the phases of one signal CIN and the other signal CFB. It produces an error signal UP when the phase of the signal CIN leads that of the signal CFB, and an error signal DWN when the phase of the signal CIN lags behind that of the signal CFB. A charge pump circuit CH receives the error signal UP or DWN and then charges or discharges a capacitor CF, thereby to control a filter voltage VF.

A sensing and discharge circuit is connected to a node where the capacitor CF is connected. The sensing and discharge circuit senses the voltage VF, and it forcibly discharges the node when the voltage VF has become higher than a certain voltage V1, whereas it stops the discharging operation when the voltage VF has become lower than a certain voltage V2. This sensing and discharge circuit is configured of a voltage divider circuit which is constituted by resistor elements R1, R2 and R3, comparators CMP1 and CMP2 which compare the filter voltage VF with the respective voltages V1 and V2 produced by the voltage divider circuit, a flip-flop circuit FF which is set/reset by the outputs of the comparators CMP1 and CMP2, and a switching MOSFET N4 whose on/off is controlled by the output of the flip-flop circuit FF.

In FIG. 5, symbol VCO denotes a voltage-controlled oscillator circuit which oscillates at a frequency corresponding to the filter voltage VF, and which produces an oscillation signal CK. Signals CK8, CK4 and CK2, for example, at various frequencies are produced by passing the oscillation signal CK through frequency dividers DV1, DV2 and DV3 of frequency division ratios different from one another, and they are supplied to the output buffers. As for the signal CK8 produced by the frequency divider DV1, this signal CK8 is supplied to output buffers BF6 to BF7 and BF9 to BF10, the outputs of which are further supplied to output buffers BI1 to BI4. Two sorts of output buffer are similarly disposed for each of the other frequency dividers.

As understood from the illustration, the circuits other than the output buffers BI1 to BI4 are supplied with a voltage VDD as their power supply voltage through a switch SW1, while the output buffers BI1 to BI4 are supplied with a voltage VTT as their power supply voltage through a switch SW2. Although not especially restricted, the voltage VTT is set at a level lower than the voltage VDD. In this way, the amplitudes of the clock signals can be made smaller so as to transfer these clock signals at a higher speed. From a different viewpoint, the output buffers BI1 to BI4 can be considered to be interface circuits for the lower amplitudes.

The clock signals generated in the semiconductor integrated circuit device are outputted outside the integrated circuit device through the output buffers fed with the power supply voltage VTT. In this embodiment, the output buffers are disposed in a one-to-one correspondence with integrated circuit devices to which the clock signals are supplied.

Among the plurality of clock signals, one signal CK8-P, CK8-N passed through the ⅛ frequency divider DV1 turns into a feedback signal CKFB-P, CKFB-N, which is brought back to the (signal CFB) phase comparator PD through the input buffers similarly to the reference clock signal CKIN-P, CKIN-N, so as to form the feedback loop of the PLL.

Thus, the PLL controls the internal circuits so that the phases and frequencies of the signals CIN and CFB being the inputs of the phase comparator PD may come into agreement. Therefore, the VCO oscillates at a frequency which is 8 times higher than the timing signal (reference clock signal), and the signal CK8 obtained by subjecting the oscillation signal CK of the VCO to the ⅛ frequency division comes to have the same frequency as that of the timing signal. The signal CK8 is pulled in so as to agree in phase with the timing signal, at the point at which it has been fed back through the output buffers and the input buffers. Thenceforth, the state of the signal CK8 is held.

In this system, the construction of the part from the reference clock signal CKIN-P, CKIN-N to the input signal CIN is the same as that of the part from the feedback clock signal CKFB-P, CKFB-N to the input signal CFB. Therefore, the phases of the reference clock signals CKIN-P, CKIN-N and the feedback clock signals CKFB-P, CKFB-N (that is, the CK8-P, CK8-N) come into agreement. Further, the phases of all the output clock signals come into agreement with the phases of the reference clock signals CKIN-P, CKIN-N by equalizing the delays of the output clock signals which are produced by passing the oscillation signal CK through the frequency dividers and the output buffers.

A power source VT feeds the power supply voltage VTT through the switch SW2 to the semiconductor integrated circuit device shown in FIG. 5, while a power source VD feeds the power supply voltage VDD through the switch SW1 to the integrated circuit device shown in the figure. Besides, the power supply voltages VDD and VTT are fed to integrated circuit devices not shown in the figure, by turning on the switches SW1 and SW2.

Figure 6:
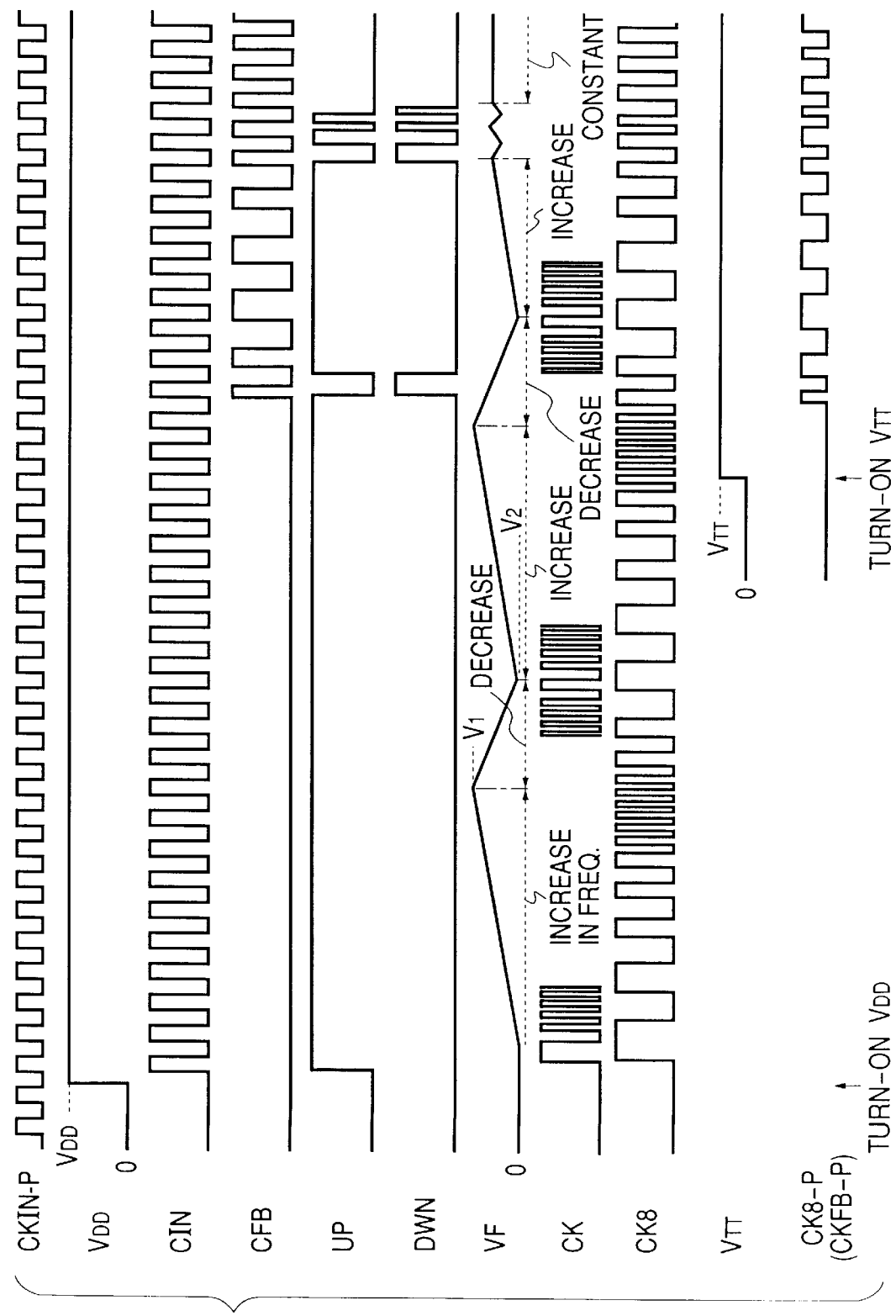
FIG. 6 is a waveform diagram showing the operation of the system illustrated in FIG. 5.

FIG. 6 illustrates the operating waveforms of the various parts when, in the clock LSI shown in FIG. 5, the power supply voltages VDD and VTT are activated by turning on the switches SW1 and SW2.

In the initial state of the clock LSI, only the external timing signals (reference clock signal) CKIN-P, CKIN-N are inputted, and the power supply voltages VDD and VTT are not activated yet. Therefore, both the power supply voltages VDD and VTT are at the ground level of the circuit, and all the internal signals are at the ground level.

When the power supply voltage VDD is supplied by bringing the switch SW1 into the on state, the circuits of the clock LSI except the output buffers BI1 to BI4, for example, which are fed with the power supply voltage VTT, start operating. More specifically, the input buffers BF1 and BF2 which receive the timing signal CKIN-P, CKIN-N operate to feed the signal CIN to the phase comparator PD. Since only the signal CIN is inputted, the phase comparator PD produces the error signal UP. Accordingly, the charge pump CH charges the capacitor CF to raise the filter voltage VF.

Then, the VCO oscillates at an oscillation frequency corresponding to the filter voltage VF. Therefore, the oscillation signal CK gradually increases in frequency, and the signal CK8 obtained by subjecting the signal CK to the ⅛ frequency division increases in frequency similarly.

Since, however, the output buffers BI1 and BI2 which transfer the clock signal CK8 to the LSI itself through the respective feedback signal lines BL1 and BL2 are not fed with the power supply voltage VTT yet, the clock signals CK8-P, CK8-N and the feedback clock signals CKFB-P, CKFB-N remain at the ground level, and the signal CFB inputted to the phase comparator PD does not change from the ground level. In this state, the feedback loop of the PLL is cut off to make the negative feedback control ineffective, and the control voltage VF continues to rise.

On this occasion, ordinarily a steady state is established at the abnormal operating point at which the control voltage VF has reached the power supply voltage VDD. In contrast, the clock LSI of this embodiment is provided with the means for sensing the control voltage VF, and for forcibly discharging the filter capacitor CF when the voltage VF has become higher than the certain voltage V1 and for stopping the discharge when it has become lower than the certain voltage V2. Therefore, at the point of time at which the voltage VF has exceeded the voltage V1, the capacitor CF is discharged. Consequently, the voltage VF lowers, and the frequencies of the signals CK and CK8 become lower.

When the voltage VF has fallen below the voltage V2 in due course, the operation of discharging the capacitor CF is stopped, and the voltage VF comes to rise again. Accordingly, the clock LSI of this embodiment operates so as to repeat the rise and fall of the voltage VF until the power supply voltage VTT is activated.

Subsequently, when the power supply voltage VTT is supplied by bringing the switch SW2 into the on state, the output buffers BI1 to BI4, for example, which are fed with the power supply voltage VTT start operating. In this state, the output clock signals can be outputted from the LSI.

In the example shown in FIG. 6, however, the power supply voltage VTT is supplied when the control voltage VF is high. In this state, the VCO is oscillating at a high frequency, and the frequency of the signal CK8 obtained by dividing the high frequency is higher than the operating frequency of the corresponding output buffers BI1 and BI2. Therefore, the output buffers BI1 and BI2 become stuck, and the signals CK8-P, CK8-N do not change from the ground level. Thus, the clock LSI cannot escape from the state that the feedback loop of the PLL is disconnected to cause the negative feedback control to be ineffective, and the control voltage VF continues to rise. Incidentally, the expression "being stuck" signifies the state that the potential change of a clock signal is too fast, so that the clock signal can be substantially regarded as no change.

The sensing and discharge circuit provided in the integrated circuit device discharges the capacitor CF when the control voltage VF has risen above the voltage V1. Thus, the control voltage VF falls, and the oscillation frequency of the VCO lowers. After the frequency of the signal CK8 has become lower than the operating frequency of the output buffers BI1 and BI2, these output buffers operate normally. Then, the level change of the signals CK8-P, CK8-N takes place, and the feedback clock signal CFB comes to be inputted to the phase comparator PD accordingly.

Thereafter, when the voltage VF has become lower than the voltage V2, the discharging of the capacitor CF is stopped. Thenceforth, the PLL can perform the normal pull-in operation and a steady state is set up.

In this manner, even when the supply of the power supply voltage VTT has lagged, the clock signal of desired frequency can be generated. That is, the clock signal of desired frequency can be generated without considering the power-on sequence of the power supply voltages. Accordingly, it is necessary only to consider the timings of feeding the power supply voltages to the other integrated circuit devices.

Figure 7:
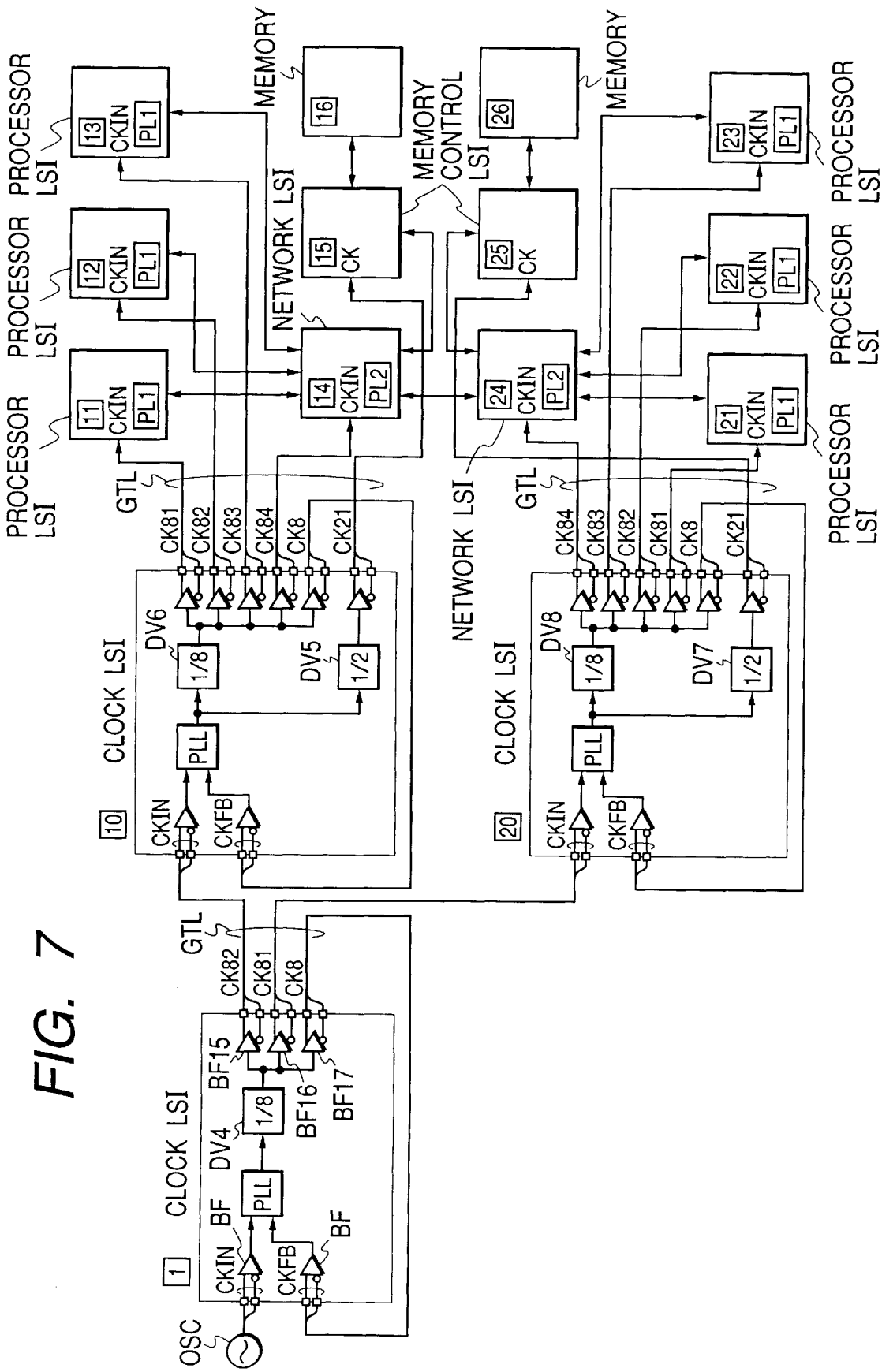
FIG. 7 is a block diagram of a system which comprises semiconductor integrated circuit devices each including a clock pulse generator circuit, processor integrated circuit devices, network integrated circuit devices, memory control integrated circuit devices and memories.

FIG. 7 illustrates an example of a multiprocessor system in which synchronized clock signals are distributed to a plurality of semiconductor integrated circuit devices by using the clock LSI as shown in FIG. 5.

A clock signal serving as the reference of the whole system is generated by, for example, a crystal oscillator OSC. The clock signal from the crystal oscillator OSC is supplied to a clock LSI (semiconductor integrated circuit device) 1 which feeds clock signals synchronized by employing a PLL. The output of the clock LSI 1 is supplied to clock LSIs (semiconductor integrated circuit devices) 10 and 20 each of which similarly generates clock signals synchronized by employing a PLL. Clock signals to be supplied to processor LSIs (an example of such processor LSIs will be described later with reference to FIG. 11(A)), network LSIs and memory control LSIs are generated and distributed by the two-stage structure of the clock LSI 1 and the clock LSIs 10, 20 in this manner.

Although clock lines inside each of the LSIs operating in accordance with the clock signals are not clearly drawn, each of the processor LSIs 11 to 13 and 21 to 23 for running programs and the network LSIs 14 and 24 for managing data among the LSIs operates and distributing clock signals which are generated by multiplying the frequency of the clock signal by means of PLLS. In the figure, the PLLs are denoted by PL1 or PL2. Each of the memory control LSIs 15 and 25 for controlling memories 16 and 26, respectively, operates and distributing the inputted clock signal. Though the structures of the clock systems inside the LSIs are different, the references of the operations of the LSIs are the distributed clock signals, and these signals are synchronized among the LSIs, thereby to realize the high-speed data transfer among the LSIs.

Figure 8:
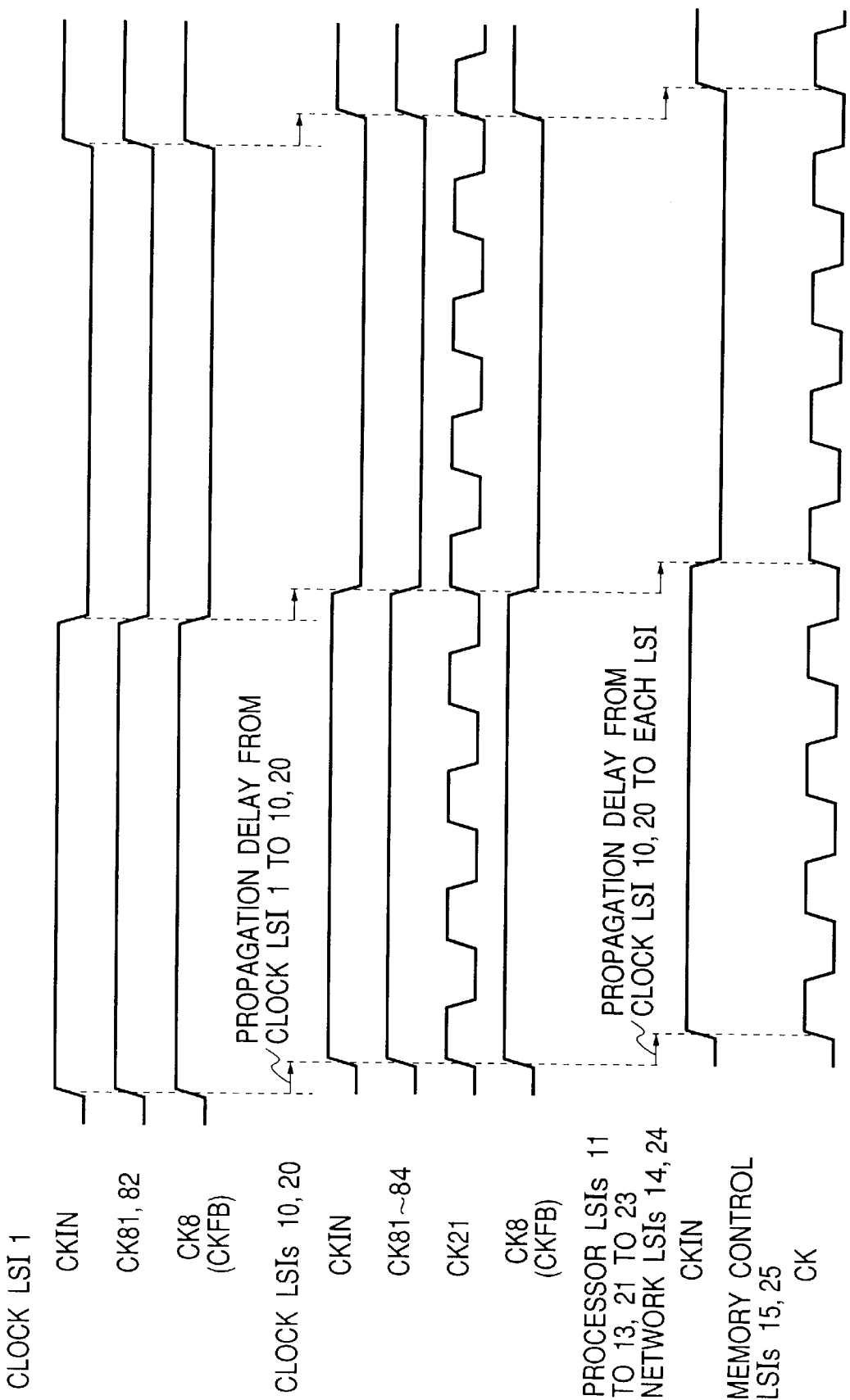
FIG. 8 is an operating waveform diagram corresponding to FIG. 7.

FIG. 8 illustrates the clock waveforms of the LSIs shown in FIG. 7.

The clock LSI 1 receives the reference clock signal of the whole system at a terminal CKIN, and returns the output CK8 to a terminal CKFB of its own as the feedback signal of the PLL. Thus, clock signals CK8, CK81 and CK82 each of which has the same phase and same frequency as those of the reference clock signal CKIN are produced. The clock signals CK81 and CK82 are respectively supplied to the clock LSIs 10 and 20.

Each of the clock LSIs 10 and 20 receives at a terminal CKIN the clock signal whose phase lags by the delay of propagation from the clock LSI 1.

On this occasion, the length of the clock wiring line from the clock LSI 1 to the clock LSI 10 is equalized to that of the clock wiring line to the clock LSI 20, whereby the clock signal CKIN of the clock LSI 10 and that of the clock LSI 20 come to have the same phases. Besides, each of the clock LSIs 10 and 20 brings the output CK8 back to a terminal CKFB of its own as the feedback signal of the PLL, whereby it can produce clock signals CK8 and CK81 to CK84 each of which has the same phase and same frequency as those of the input clock signal CKIN, and a clock signal CK21 the phase of which is the same as that of the input clock signal CKIN, but the frequency of which is 4 times higher than that of the input clock signal CKIN. Herein, although not especially restricted, the clock signals CK81 to CK84 are supplied to the processor LSIs 11 to 13 and 21 to 23 and the network LSIs 14 and 24, and the clock signal CK21 is supplied to the memory control LSIs 15 and 25.

Each of the processor LSIs, network LSIs and memory control LSIs is supplied at a terminal CKIN or CK with the clock signal whose phase lags by the delay of propagation from the clock LSI 10, 20.

Also on this occasion, all the clock signals inputted to the corresponding LSIs can be made the same in phase by equalizing the lengths of all clock wiring lines from the clock LSIs 10 and 20 to the corresponding LSIs.

Although not especially restricted, interfaces of low amplitude are provided between the clock LSIs and between the clock LSIs and the corresponding LSIs. In this embodiment, so-called GTL interfaces are adopted.

Figure 9:
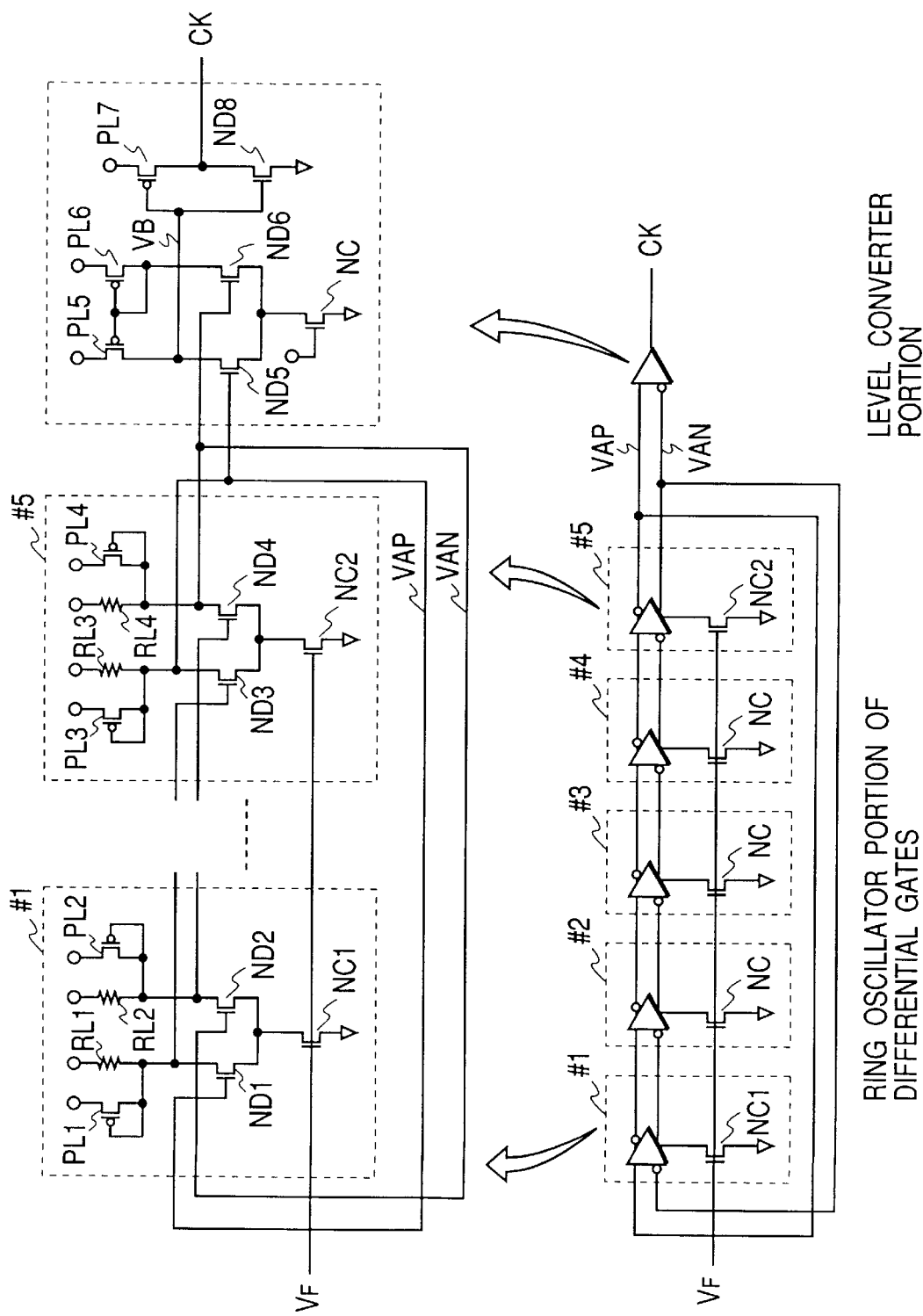
FIG. 9 is a circuit arrangement diagram of a voltage-controlled oscillator circuit.

FIG. 9 illustrates an example of a voltage-controlled oscillator VCO which employ differential gates.

An oscillator called ring oscillator is constructed by connecting a plurality of differential gates into a ring. The output of the ring oscillator is outputted through a level conversion portion.

Each of the differential gates is configured of a differential transistor pair of N-channel MOSFETs, loads in each of which a resistor is connected in parallel with a diode-connected P-channel MOSFET for clamping the signal amplitude, and an N-channel MOSFET whose gate receives the control voltage VF. When the control voltage VF changes, a bias current for the differential transistor pair changes. Therefore, the circuit delay of the differential gate changes, and the oscillation frequency of the oscillator changes.

Since the signal amplitude of the differential gate is clamped to a small amplitude by the diode-connected P-channel MOSFET, the circuit delay is short, and oscillation of high frequency can be realized. A level converter (differential amplifier+CMOS inverter) is required to output an oscillation signal CK produced by amplifying small amplitude signals VAP, VAN to the amplitude of the power supply voltage.

Figure 10:
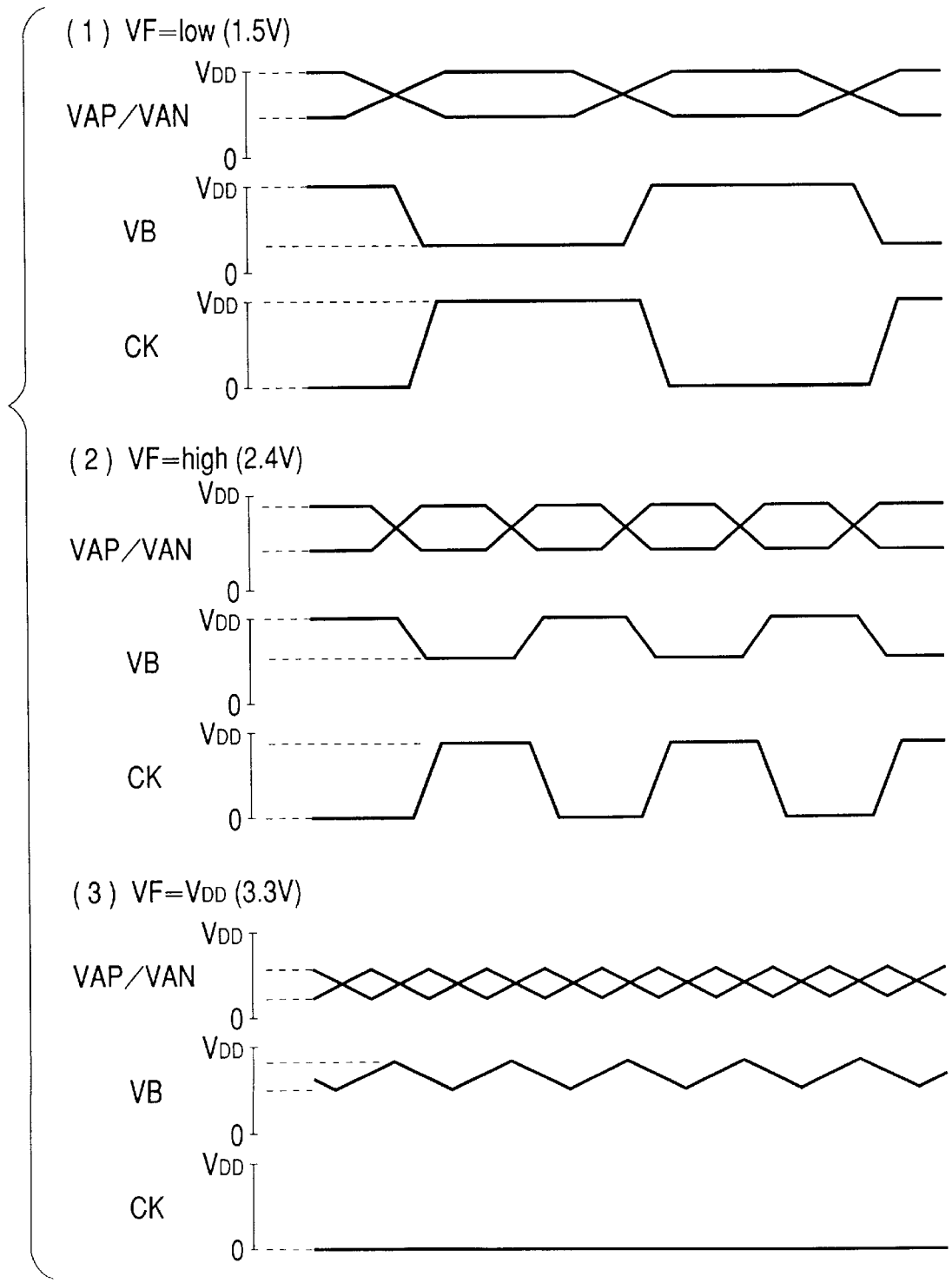
FIG. 10 illustrates operating waveform diagrams corresponding to FIG. 9.

FIG. 10 illustrates operating waveforms at several positions of the voltage-controlled oscillator shown in FIG. 9. FIG. 10(1) to FIG. 10(3) show the differences of the waveforms at the positions when the control voltage VF is heightened in succession. When the control voltage VF is low (for example, 1.5 V), the bias current for the differential transistor pair is small. Therefore, the circuit delay is long, and the oscillation period of the oscillator becomes long. When the control voltage VF is made high (for example, 2.4 V), the bias current for the differential pair is larger.

Therefore, the circuit delay is shorter, and the oscillation period becomes shorter. When the control voltage VF is heightened to the power supply voltage VDD, the oscillation cycle shortens. The signal amplitude, however, becomes small because the differential transistor pair in each differential gate switches and the next operation begins before the completion of the charging/discharging of the loads. As a result, the level converter (differential amplifier+CMOS inverter) for amplifying the signal amplitude becomes stuck and becomes incapable of outputting the oscillation signal CK.

Figure 11A:
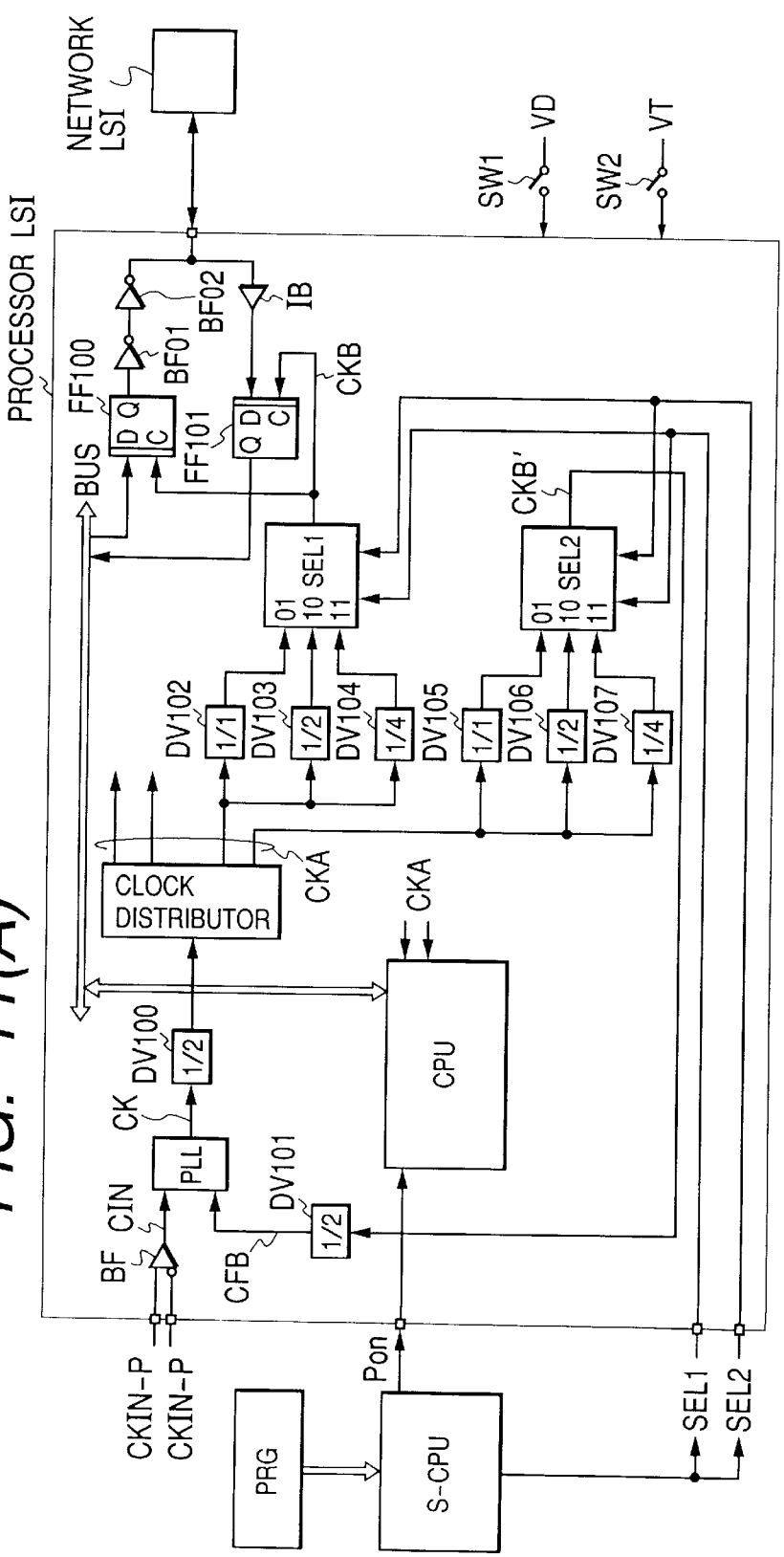
FIGS. 11(A) and 11(B) are a block diagram and a waveform diagram for explaining an example of a processor integrated circuit device, respectively.

FIG. 11(A) shows a processor LSI (semiconductor integrated circuit device) which has a built-in function of varying internal operating frequency by use of a PLL, together with the peripheral blocks thereof.

The processor LSI comprises a processor unit CPU, a clock pulse generator circuit and an input/output circuit. The clock pulse generator circuit includes a clock distributor, a plurality of frequency dividers DV100 to DV107, selectors SEL1 and SEL2 for selecting from the outputs of the frequency dividers, and a circuit PLL constituting part of a PLL circuit. Although not especially restricted, the circuit PLL which constitutes the PLL circuit has the same construction as that of the circuit PLL shown in FIG. 5. That is, although not shown in the drawing, the circuit PLL is configured of a phase comparator PD, a charge pump circuit CH, a voltage-controlled oscillator VCO, a filter capacitor CF, and a detection and discharge circuit (R1 to R3, COMP1, COMP2, FF, N4). The PLL circuit is constructed by combining the circuit PLL with the clock distributor, frequency dividers and selectors. A clock signal CKA generated by the PLL circuit is supplied to the processor unit CPU, which operates in accordance with the clock signal. In addition, the processor unit CPU is connected to the input/output circuit through an internal bus BUS. The input/output circuit is configured of a flip-flop circuit FF100 which takes in data on the bus BUS in accordance with a clock signal CKB fed from the clock pulse generator circuit, a flip-flop circuit FF101 which similarly takes in external data in accordance with the clock signal CKB fed from the clock pulse generator circuit, output buffers BF01 and BF02 which are connected between the output terminal of the flip-flop circuit FF100 and an external terminal, and an input buffer IB which is connected between the external output and the input terminal of the flip-flop circuit FF101. Although no special restriction is made, a network LSI is connected to the external terminal. Besides, the processor LSI is fed with a power supply voltage VD through a switch SW1 and a power supply voltage VT through a switch SW2.

In the drawing, symbol S-CPU denotes a service processor, while symbol PRG denotes a program which is run by the service processor S-CPU. This service processor runs the program PRG at, for example, the turn-on of a power source. The processor LSI, network LSI, etc. are initialized by the run of the program. By way of example, owing to the run of the program, the service processor S-CPU sets selection conditions in the selectors SEL1 and SEL2 through the external terminals SEL1 and SEL2 of the processor LSI. Besides, it supplies the processor unit CPU with a reset signal Pon for initialization.

The circuit PLL receives an external timing signal CKIN-P, CKIN-N through an input buffer BF. The PLL circuit which is configured of the circuit PLL, frequency dividers DV100 and DV101, a clock distributor, frequency dividers DV105 to DV107 and a selector SEL2, operates so that a signal CIN from the input buffer BF and a feedback clock signal CFB may agree in phase and in frequency. This PLL circuit produces an oscillation clock signal CK. The frequency of the oscillation clock signal CK is determined by the frequency division ratio of the frequency divider means which is disposed within a path extending from the output (CK) of the circuit PLL to the input (CFB) thereof. In this embodiment, the selector SEL2 is inserted in the path extending from the output (CK) of the circuit PLL to the input (CFB) thereof, and the frequency division ratio can be changed-over by the selector SEL2. The frequencies of the oscillation clock signal CK and the internal clock signal CKA fed to the processor unit CPU are changed by the condition set in the selector SEL2, whereby the processor LSI can be operated at various speeds.

Moreover, frequency division ratios can be changed-over by the selector SEL1 so that, even when the frequency of the internal clock signal CKA has changed, the frequency (of the signal CKB) may be held constant at the part of the processor LSI where the data are transferred to and from another LSI (the network LSI in the illustrated example). Thus, errors are prevented from occurring in the data transfer between the processor LSI and another LSI whose operating frequency is lower than in the processor LSI.

In this embodiment, the selector SEL2 is inserted in the feedback loop of the PLL circuit, that is, it is interposed between the output and input of the circuit PLL. Therefore, the path between them is not determined before the completion of the setting of the selector SEL2. Accordingly, the processor LSI may fall into the state that the feedback loop is cut off to make the negative feedback control ineffective.

Figure 11B:
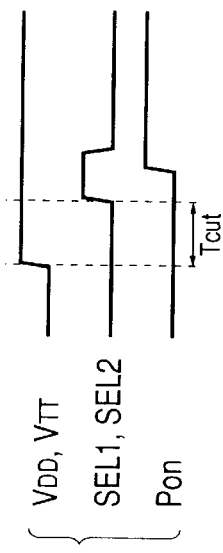

As illustrated in FIG. 11(B) by way of example, when the service processor S-CPU supplies the setting condition to the selectors SEL1 and SEL2 after turning the switches SW1 and SW2 on and the power supply voltages VDD and VTT are supplied, the feedback loop is electrically disconnected for a time period Tcut. Therefore, if the circuit PLL is not provided with the detection and discharge circuit, the PLL circuit sometimes runs away as described before. In this embodiment, however, the detection and discharge circuit operates to detect the control voltage VF and to perform the discharging operation when the control voltage VF has exceeded a predetermined value. It is therefore possible to prevent any abnormal clock signal from being generated and to prevent the runaway from occurring. In other words, this embodiment can lighten the restriction between the timing of the turn-on of the power source and the timing of setting the condition in the selector. By the way, an example of the reset signal Pon which is generated by the service processor S-CPU is also shown in FIG. 11(B).

FIG. 12 illustrates the waveforms of the clock signals inside the processor LSI shown in FIG. 11(A).

FIGS. 12(1) to 12(3) show the differences of the clock signals CK and CKA when the frequency division ratio is changed by the selector SEL2 inserted in the path extending from the clock signal CK to the feedback clock signal CFB. By equalizing circuit delays in the selector portion, the other signals remain unchanged even when the above setting is changed (when the selector SEL1 in the path extending from the clock signal CKA to the clock signal CKB is similarly changed-over).

FIG. 12(1) shows an example where ¼ frequency division is selected. In this case, the path extending from the clock signal CK to the feedback clock signal CFB undergoes ¼ frequency division, and hence, the clock signal CK becomes 4 times higher in frequency than the reference clock signal CKIN. FIG. 12(3) shows an example where ¼ frequency division is selected. In this case, the path extending from the clock signal CK to the feedback clock signal CFB undergoes ¹⁄₁₆ frequency division, and hence, the clock signal CK becomes 16 times higher in frequency than the reference clock signal CKIN. The clock signal CKA which is obtained by passing the clock signal CK through the ½ frequency divider DV100 and which is distributed to all the internal parts of the processor LSI, has a frequency which is half of the frequency of the clock signal CK. In addition, FIG. 12(2) illustrates an example where ½ frequency division is selected.

Figures 13A, 13B:
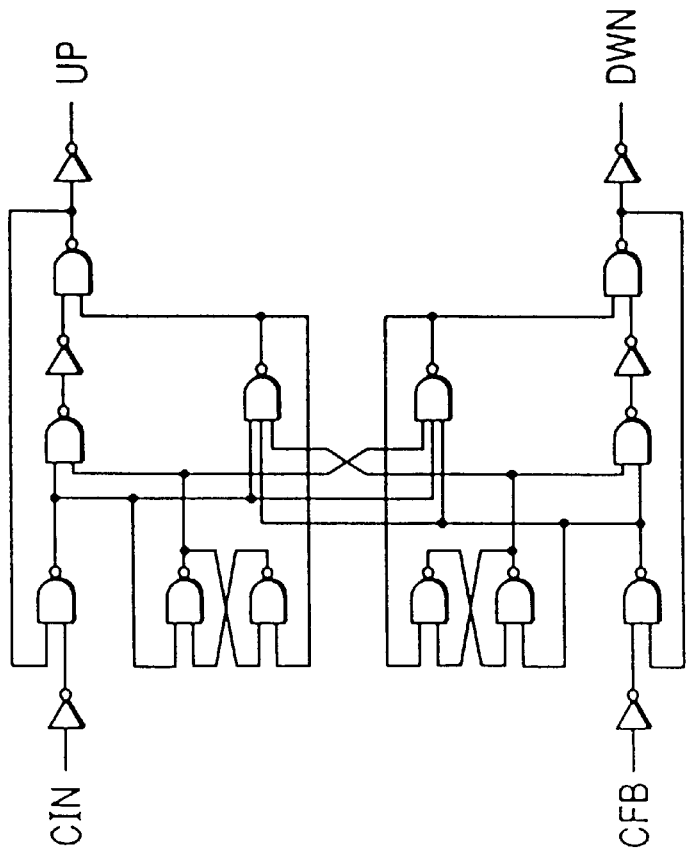
FIG. 13A is a circuit arrangement diagram of a phase comparator circuit, and FIG. 13B a table.

FIG. 13A illustrates a circuit diagram of one embodiment of the phase comparator mentioned before. The phase comparator is a circuit of edge trigger type wherein the outputs UP and DWN change only at the rise of an input signal CIN or CFB in accordance with the states of internal nodes and the outputs. Irrespective of the levels of the input signal, three states exist as the outputs. The input/output states of the phase comparator are also tabulated in table 13B. The phase comparator will not be described more, and the operation thereof will be understood from the illustrated table of the input/output states.

In the foregoing, the circuit which detects the value of the control voltage VF and lowers the control voltage VF when the detected value has reached, the predetermined value or more, has been described as the detection and discharge circuit. From a different viewpoint, however, such a circuit can be regarded as a detection and setting circuit which detects the state of the PLL circuit and which brings the PLL circuit into a predetermined state when the detected state is not the predetermined state. In more detail, the circuit can be regarded as a detection and setting circuit which detects the state of the PLL circuit when the feedback loop constituting the PLL circuit has been electrically disconnected, and brings the PLL circuit into a predetermined state.

Functional effects obtained by the foregoing embodiments will be described below.

(1) In a PLL circuit having a phase comparator which makes a comparison between an internal clock signal and a clock signal supplied from an external terminal, a charge pump circuit which produce a charging-up or discharging current in accordance with the output of the phase comparator, so as to drive a filter capacitor, a voltage-controlled oscillator the oscillation frequency of which is controlled by the held voltage of the filter capacitor, and a frequency divider circuit which generates the internal clock signal on the basis of the oscillation output of the voltage-controlled oscillator; a PLL circuit is additionally provided with a voltage detector circuit which detects that the held voltage of the filter capacitor has been raised to a predetermined voltage or more, and the function of forcibly lowering the held voltage of the filter capacitor down to a predetermined potential in accordance with the detection output of the voltage detector circuit. This produces the effect that a semiconductor integrated circuit device including the PLL circuit capable of generating clock signals reliably and stably can be obtained.

(2) A clock signal supplied from a first external terminal is fed to one input of a phase comparator through a first input buffer, an internal clock signal subjected to frequency division is outputted from a second external terminal through a buffer, and it is fed from a third external terminal to the other input of the phase comparator through a second input buffer which is equivalent to the first input buffer. This produces the effects that the clock signal outputted from the second external terminal can be synchronized with the clock signal supplied to the first external terminal, and clock signals can be generated reliably and stably.

(3) The voltage detector circuit is constructed of a first voltage detector circuit which detects that the held voltage of the filter capacitor has been raised to the predetermined voltage or higher, and a second voltage detector circuit which detects that the held voltage has been lowered to a predetermined potential or higher, wherein the filter capacitor is discharged by the detection output of the first voltage detector circuit, and the discharging operation is stopped by the detection output of the second voltage detector circuit. This produces the effect that abnormal operation can be stably stopped.

(4) The voltage-controlled oscillator includes a first voltage-to-current converter circuit which converts into a current signal the held voltage of the first filter capacitor that is charged or discharged by the output current of the charge pump circuit, a voltage amplifier circuit which amplifies the held voltage of the first filter capacitor, a second filter capacitor which is driven by the output of the voltage amplifier circuit, a second voltage-to-current converter circuit which converts the held voltage of the second filter capacitor into a current signal, an adder circuit which adds up the output currents of the first and second voltage-to-current converter circuits, and a current-controlled oscillator whose oscillation frequency is controlled by the output current of the adder circuit. This produces the effect that clock signals can be generated reliably and stably while the operating range is widened.

(5) A PLL circuit is provided with a selector for selecting a frequency division ratio, whereby even when a feedback loop has fallen into an electrically disconnected state, the state is detected by a detection and setting circuit, and the PLL circuit is brought into a predetermined state by the detection and setting circuit. Therefore, the PLL circuit can reliably generate clock signals.

(6) A PLL circuit which is operated by a plurality of sorts of power supply voltage is provided with a detection and setting circuit, so that the PLL circuit can reliably generate clock signals without considering the turn-on sequence of the power source. Therefore, in a system having semiconductor integrated circuit devices which include the PLL circuit that is operated by the plurality of sorts of power supply voltage, limitations concerning the turn-on sequence of the power source can be relieved.

(7) A semiconductor integrated circuit device including a PLL circuit the feedback loop of which is laid outside the semiconductor integrated circuit device, is provided with a detection and setting circuit. Therefore, even when the feedback loop is electrically disconnected due to frequency characteristics of the feedback loop, clock signals can be reliably generated.

Although, in the above, the invention made by the inventor has been concretely described in conjunction with embodiments, it is needless to say that the present invention is not narrowly restricted to the foregoing embodiments, but various alterations are possible within a scope not departing from the purport of the invention. By way of example, all feedback loops may be laid within a semiconductor integrated circuit device. It is also possible to impart the function of changing-over frequency division ratios by the change-over of a switch, by providing the switch and a plurality of frequency divider circuits are disposed beforehand between external terminals which constitute the feedback loop. Besides, a semiconductor integrated circuit device may be any, for example, one which constructs a single-chip microcomputer or microprocessor.

Effects attained by the typical aspects of the present invention will be briefly described as follows. In a PLL circuit having a phase comparator which makes a comparison between an internal clock signal and a clock signal supplied from an external terminal, a charge pump circuit which produces a charging-up or discharging current in accordance with the output of the phase comparator, so as to drive a filter capacitor, a voltage-controlled oscillator the oscillation frequency of which is controlled by the held voltage of the filter capacitor, and a frequency divider circuit which generates the internal clock signal on the basis of the oscillation output of the voltage-controlled oscillator; there are added a voltage detector circuit which detects that the held voltage of the filter capacitor has been raised to a predetermined voltage or higher, and the function of forcibly lowering the held voltage of the filter capacitor down to a predetermined potential in accordance with the detection output of the voltage detector circuit, whereby a semiconductor integrated circuit device including the PLL circuit capable of generating clock signals reliably and stably can be obtained.

A detection and setting circuit which detects a state brought about by the electrical disconnection of the feedback loop of a PLL circuit and which brings the PLL circuit into a predetermined state, is provided in a semiconductor integrated circuit device, so that limitation on the turn-on sequence of the power source can be relieved in a system which employs the semiconductor integrated circuit device. Besides, even in a system in which a feedback loop is laid outside a semiconductor integrated circuit device, a PLL circuit can reliably generate clock signals. Further, a PLL circuit is provided with a selector, whereby the PLL circuit can reliably generate clock signals even when the feedback loop thereof has been electrically disconnected.

What is claimed is:

1. A system comprising:
   a first switch which controls feed of a first power supply voltage;
   a second switch which controls feed of a second power supply voltage;
   a PLL circuit which includes a first circuit that is operated by said first power supply voltage, and a second circuit that is operated by said second power supply voltage;
   a wiring line which feeds said first circuit with a feedback clock signal outputted from said second circuit;
   said first circuit which includes a phase comparator circuit which detects a phase difference between a reference clock signal and said feedback clock signal, a control circuit which produces a control voltage conforming to an output of said phase comparator circuit, and a voltage-controlled oscillator circuit which generates a clock signal of a frequency conforming to the control voltage;
   said second circuit including a circuit which receives an output of the voltage-controlled oscillator circuit and provides said feedback clock signal; and
   a setting circuit which detects a state of operating state of said PLL circuit whose frequency is higher than a predetermined frequency for said PLL circuit due to said feedback clock signal being electrically disconnected, and which brings said PLL circuit into a predetermined state in accordance with a result of the detection;
   wherein the feedback clock signal becomes electrically disconnected in one of the following three cases including:
      a first case in which the second switch does not supply the second voltage to the second circuit;
      a second case in which the second circuit does not provide the feedback clock signal even though the second switch supplies the second voltage to the second circuit; and
      a third case in which before the feedback clock signal is properly supplied to the phase comparator, the phase comparator outputs a result of a comparison.

2. A system comprising:
   a first switch circuit providing a first voltage;
   a second switch circuit providing a second voltage different from the first voltage;
   a phase locked loop circuit including:
      a phase comparator operated by the first voltage and coupled to receive both a reference clock signal and a feed back clock signal and providing a control signal based on detection of the difference between the reference clock signal and a feedback clock signal;
      a charge pump circuit operated by the first voltage and coupled to receive the control signal and providing a control voltage based on the control signal;
      a voltage-controlled oscillator operated by the first voltage and coupled to receive the control voltage and providing a clock signal whose frequency is controlled by the control voltage; and
      a circuit operated by the second voltage and coupled to receive the clock signal and providing the feedback clock signal; and
   a setting circuit coupled to the phase locked loop circuit and detecting whether or not the frequency of the clock signal is in a predetermined frequency range and controlling the phase locked loop circuit so that the phase locked loop circuit provides the clock signal with a frequency placed in the predetermined frequency range when the frequency of the clock signal is detected to be outside of the predetermined frequency range due to the feedback clock signal being electrically disconnected;
   wherein the feedback clock signal becomes electrically disconnected in one of the following three cases including:
      a first case in which the second switch does not supply the second voltage to the second circuit;
      a second case in which the second circuit does not provide the feedback clock signal even though the second switch supplies the second voltage to the second circuit; and
      a third case in which before the feedback clock signal is properly supplied to a phase comparator, the phase comparator outputs a result of a comparison.

3. A system comprising:
   a first switch circuit providing a first voltage;
   a second switch circuit providing a second voltage different from the first voltage;
   an external terminal to which a third voltage different from the first and the second voltages is supplied,
   a phase locked loop circuit operated by a voltage between the first voltage and the third voltage and coupled to receive a reference clock signal and a feedback clock signal and providing a clock signal having a frequency;
   a circuit operated by a voltage between the second voltage and the third voltage and coupled to receive the clock signal and providing the feedback clock signal;
   a wiring line coupled to receive the feedback clock signal to form a feedback loop between the circuit and the phase locked loop circuit, a setting circuit coupled to the phase locked loop circuit and lowering the frequency of the clock signal when the feedback loop is electrically disconnected and when the frequency of the clock signal exceeds a predetermined frequency;

wherein the phase locked loop circuit comprises:
- a phase comparator coupled to receive both the reference clock signal and a feedback clock signal and providing a control signal based on detection of the difference between the reference clock signal and the feedback clock signal;
- a charge pump circuit coupled to receive the control signal and providing a control voltage based on the control signal;
- a voltage-controlled oscillator coupled to receive the control voltage and providing a clock signal whose frequency is controlled by the control voltage; and
- a capacitor coupled between the charge pump circuit and the voltage-controlled oscillator, wherein the charge pump circuit is responsive to the control signal and charges or discharges the capacitor to control the voltage level of the control voltage; and wherein the feedback clock signal becomes electrically disconnected in one of the following three cases including:
- a first case in which the second switch does not supply the second voltage to the second circuit;
- a second case in which the second circuit does not provide the feedback clock signal even though the second switch supplies the second voltage to the second circuit; and
- a third case in which before the feedback clock signal is properly supplied to the phase comparator, the phase comparator outputs a result of a comparison.

* * * * *